(12) United States Patent
Kim et al.

(10) Patent No.: US 7,335,554 B2
(45) Date of Patent: Feb. 26, 2008

(54) METHOD FOR FABRICATING SEMICONDUCTOR

(75) Inventors: Jong-Man Kim, Ichon-shi (KR); Hyeon-Soo Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/618,601

(22) Filed: Dec. 29, 2006

(65) Prior Publication Data
US 2007/0254427 A1  Nov. 1, 2007

(51) Int. Cl.
H01L 21/8242 (2006.01)
H01L 21/311 (2006.01)
(52) U.S. Cl. .............. 438/248; 438/243; 438/244; 438/246; 438/254; 438/255; 438/700; 257/E21.646; 257/E21.651; 257/E21.657
(58) Field of Classification Search ........ 438/248, 438/243, 244, 246, 254, 255, 700; 257/E21.646, 257/E21.651, E21.657
See application file for complete search history.

(56) References Cited

U.S. PATENT DOCUMENTS

| | | | | |
|---|---|---|---|---|
| 5,702,969 | A * | 12/1997 | Lee | 438/239 |
| 5,900,659 | A * | 5/1999 | Lee | 257/296 |
| 6,236,079 | B1 * | 5/2001 | Nitayama et al. | 257/306 |
| 2007/0026680 | A1 * | 2/2007 | Hong | 438/700 |

* cited by examiner

*Primary Examiner*—Michael Lebentritt
*Assistant Examiner*—Mohsen Ahmadi
(74) *Attorney, Agent, or Firm*—Townsend and Townsend and Crew LLP

(57) ABSTRACT

A method for fabricating a semiconductor device includes forming a first trench by etching a substrate already provided with a storage node contact (SNC) region and a bit line contact (BLC) region, forming a protection layer on sidewalls of the first trench, forming a sacrificial layer over the substrate and filling the first trench, etching the sacrificial layer to have a portion of the sacrificial layer remain in the first trench in the BLC region of the substrate, forming a second trench extending horizontally by etching the substrate underneath the first trench, and filling the first and second trenches to form an isolation structure.

15 Claims, 6 Drawing Sheets

METHOD FOR FABRICATING SEMICONDUCTOR

BACKGROUND

The present invention relates to a method for fabricating a semiconductor device, and more particularly to a method for fabricating a semiconductor device using a local silicon-on-insulator (LSOI) process without over etching underneath the active regions.

As dynamic random access memory (DRAM) devices have become highly integrated, active regions have shrunk accordingly. Thus, it has become difficult to pattern an active region under 80 nm, and spacing distances between active regions have decreased, which increases leakage current between cells. An attempt to reduce the leakage between cells has been made by forming a deep trench to define the isolation structure. Since the isolation structure defines the active region, the length of the current channel can be increased by increasing the depth of the isolation structure.

However, a void may be generated when a subsequent oxide-based layer is used to fill the deep trench. The deep depth of the trench makes it difficult to completely fill it without any void. Furthermore, the etching needs to be performed longer to form the deep trench so an increased mask thickness is required. The deep trench and the thick mask are more prone to collapse, which results in a decrease in yield. Accordingly, a local silicon-on-insulator (LSOI) process has been introduced to overcome the above limitations.

FIG. 1A illustrates a cross-sectional view describing a typical isolation method for a semiconductor device, using an LSOI process. Isolation regions formed in a substrate 11 are etched to form first trenches 12 having a vertical profile. Sidewall insulation layers 13 are formed on the sidewalls of the first trenches 12. The first trenches 12 define an active region 11A.

An isotropic etching process is performed on portions of the substrate 11 below the first trenches 12 to form second trenches 14 using the sidewall insulation layers 13 as protection layers. The second trenches 14 are extended horizontally underneath the active region 11A. The isotropic etching process includes performing a blanket etch-back process without using a mask. The active region 11A becomes supported by a pillar 11B having a width of 'W1'. Although not illustrated, an isolation structure fills the isolation regions configured with the first trenches 12 and the second trenches 14 to complete an LSOI process.

FIG. 1B illustrates a top view of a semiconductor device after typical second trenches are formed. The second trenches are formed below active regions 21A and are extended horizontally. Forming the horizontally extended second trenches allows for the reduction of leakage current while not increasing the depth of the isolation regions.

However, forming the horizontally-extending second trenches using an isotropic etching process, e.g., blanket etch-back process, causes extension in both directions ① and ② The direction ① represents a direction toward a bit line contact region, and the direction ② represents a direction toward a storage node contact region. Consequently, the width of a pillar 21B decreases. That is, a sufficient pillar length 'L' of the active regions 21A may not be obtained, thereby causing a collapse of the active regions 21A.

FIG. 2 is a micrograph view illustrating collapsed active regions due to the insufficient pillar length of the active regions as indicated by the circled regions. The collapsed active regions may cause a decrease in yield and contamination of devices in other processes.

SUMMARY OF THE INVENTION

An embodiment of the present invention relates to a method for fabricating a semiconductor device, which can reduce leakage current and the collapse of active regions by lengthening current channels between cells without deeply etching isolation regions, i.e., without forming deep trenches.

In accordance with an aspect of the present invention, a method for fabricating a semiconductor device includes: forming a first trench by etching a substrate already provided with a storage node contact (SNC) region and a bit line contact (BLC) region; forming a protection layer on sidewalls of the first trench; forming a sacrificial layer over the substrate and filling the first trench; etching the sacrificial layer to have a portion of the sacrificial layer remain in the first trench in the BLC region of the substrate; forming a second trench extending horizontally by etching the substrate underneath the first trench; and filling the first and second trenches to form an isolation structure.

In accordance with another aspect of the present invention, a method for fabricating a semiconductor device includes: etching a substrate to form a first trench, the first trench extending in a first direction; forming first and second protection layers on first and second sidewalls of the first trench; forming a dielectric layer over the substrate to fill the first trench, the dielectric layer including a first portion provided on the first protection layer and a second portion provided on the second protection layer; etching the dielectric layer to expose a portion of the substrate provided on a lower side of the first trench, the first portion of the dielectric layer remaining on the first protection layer; etching the substrate to form a second trench extending in a second direction below the first trench; and filling the first and second trenches to form an isolation structure.

DETAILED DESCRIPTION OF THE EMBODIMENTS

Figure 1A:
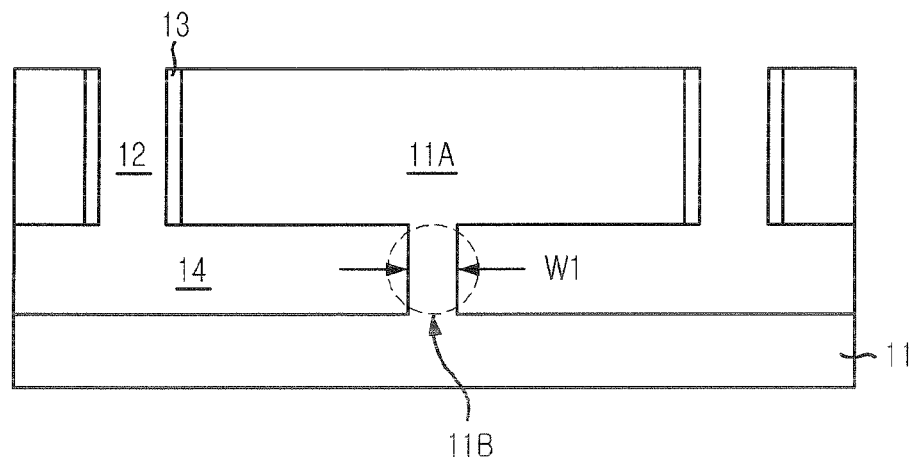
FIG. 1A illustrates a cross-sectional view to describe a typical isolation method of a semiconductor device using a local silicon-on-insulator (LSOI) process.
Figure 1B:
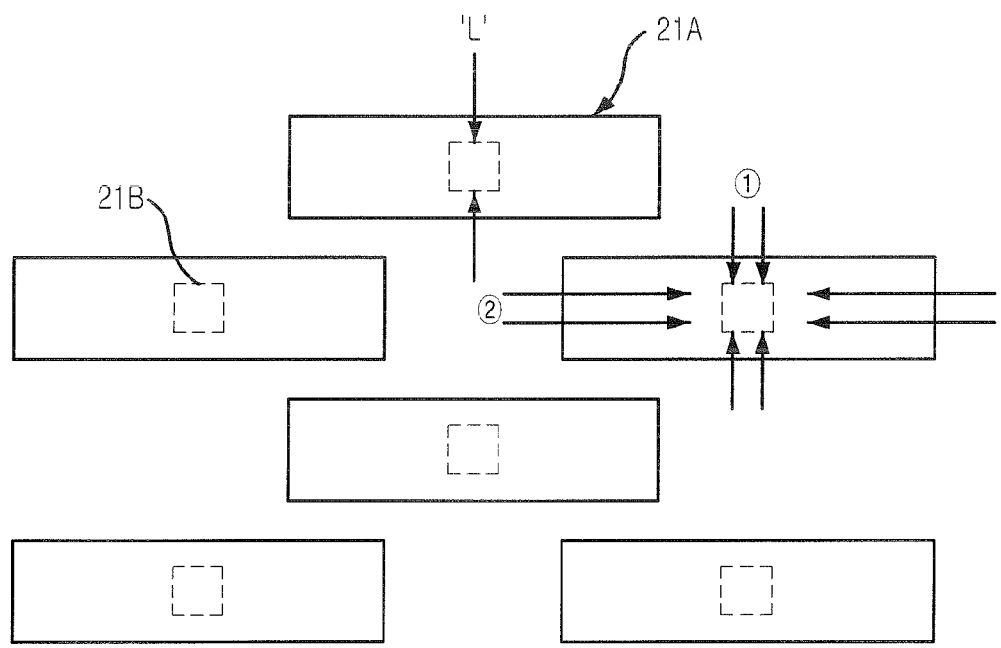
FIG. 1B illustrates a top view of a semiconductor device after typical second trenches are formed.
Figure 2:
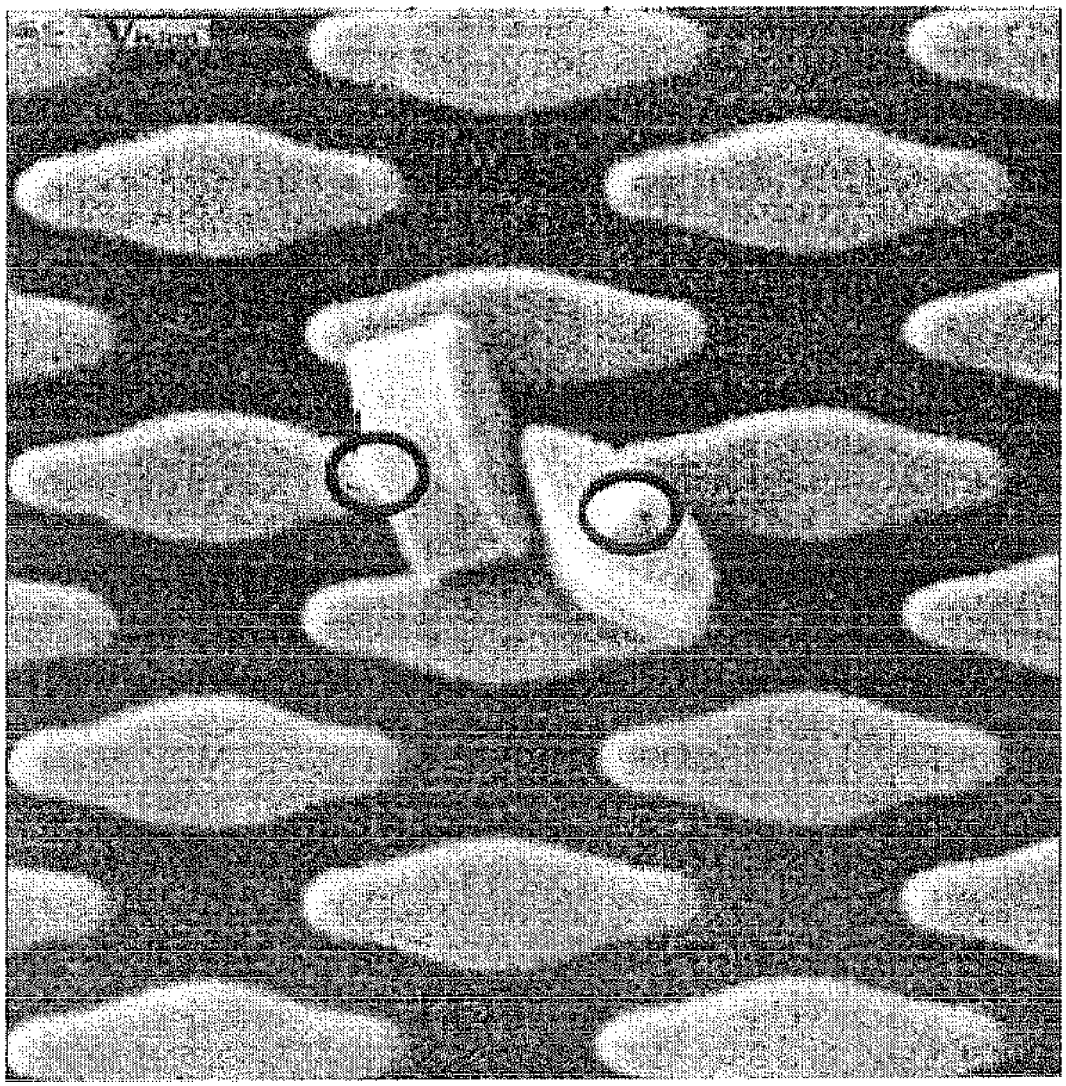
FIG. 2 illustrates a micrograph view of typically collapsed active regions.

A method for fabricating a semiconductor device in accordance with the present invention will be described in detail. Furthermore, identical or like reference numerals generally represent identical or like elements in different drawings.

Figure 3A:
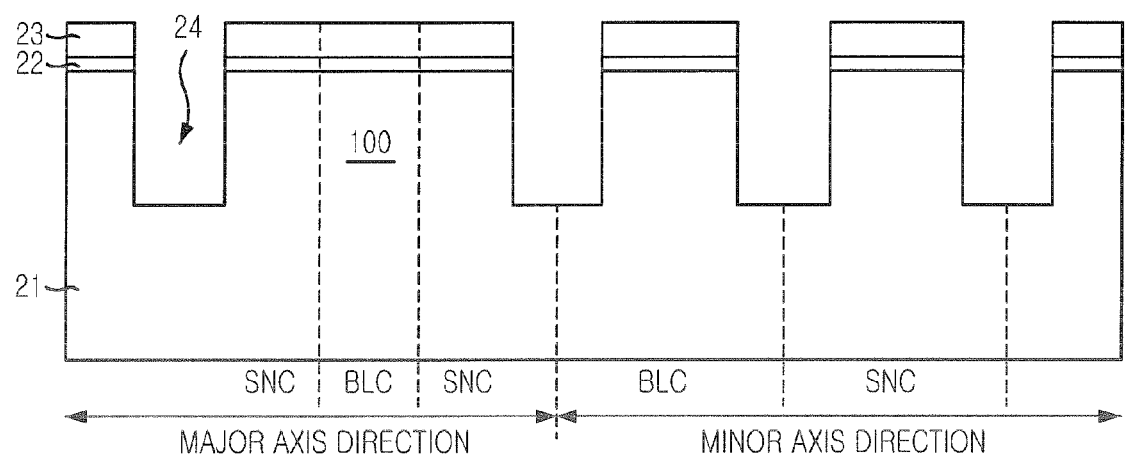
FIGS. 3A to 3F illustrate cross-sectional views to describe a method for fabricating a semiconductor device using an LSOI process consistent with an embodiment of this invention.

Referring to FIG. 3A, patterned first nitride layers 22 are formed over a patterned substrate 21, and a first mask pattern 23 is formed over the patterned first nitride layers 22. The first mask pattern 23 includes a photoresist. In more detail, a first nitride layer is formed over a substrate, and the first mask pattern 23 is formed over the first nitride layer. The first nitride layer is etched using the first mask pattern 23 as an etch mask. Exposed portions of the substrate are etched to a predetermined depth to form first trenches 24. The substrate and the first nitride layer are etched in a continuous or single etch step in the present implementation. The first trenches 24 define active regions 100 of the substrate structure. The active regions 100 include both bit line contact (BLC) regions and storage node contact (SNC) regions. In the drawings, the cross-sectional views in the major axis direction show the SNC regions and the BLC region together, and the cross-sectional views in minor axis direction separately show each of the SNC regions and the BLC region.

Figure 3B:
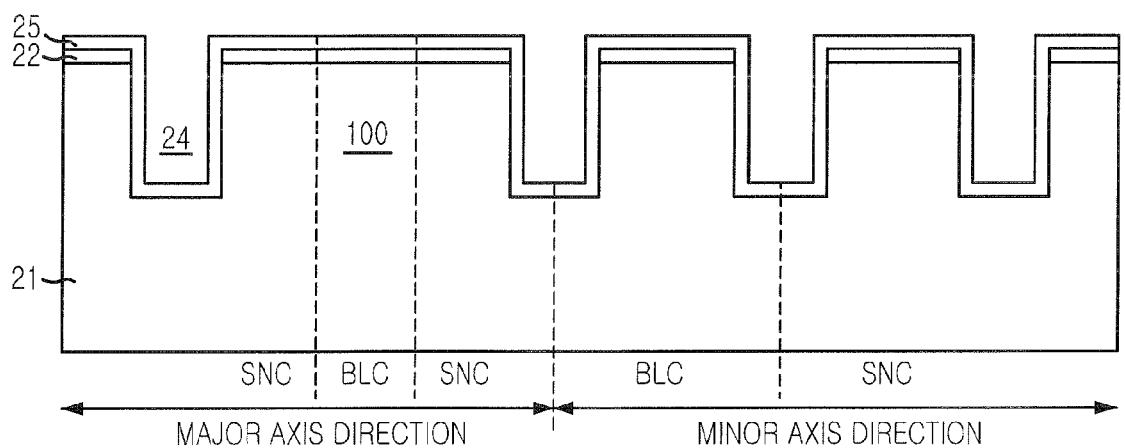
Figure 3C:
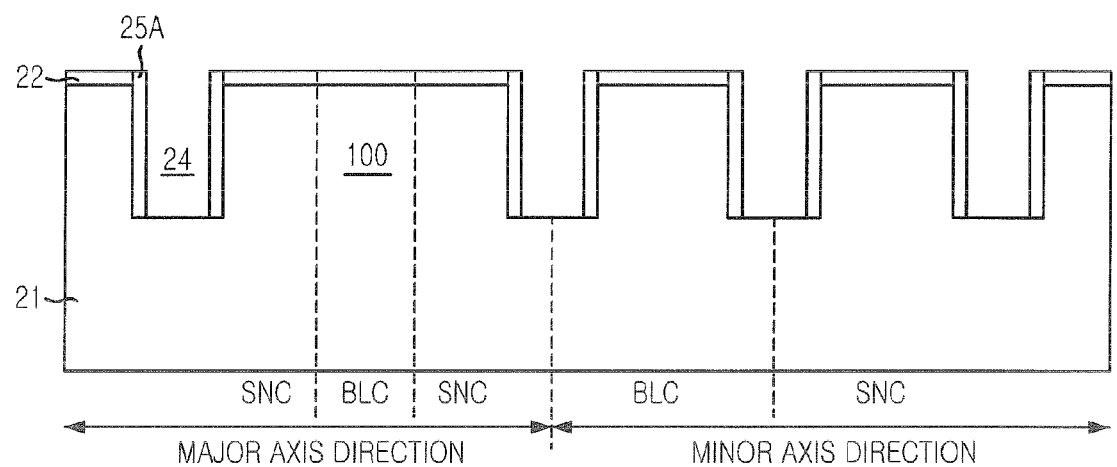

Referring to FIG. 3B, the first mask pattern 23 is removed, and a second nitride layer 25 is formed over the resulting substrate structure. Referring to FIG. 3C, an etch-back process is performed onto the second nitride layer 25 to form nitride-based sidewalls 25A functioning as a protection layer. The etch-back process is performed until the top surfaces of the patterned first nitride layers 22 are exposed. Thus, portions of the second nitride layer 25 formed over the top surfaces of the patterned first nitride layers 22 and bottom surfaces of the first trenches 24 are selectively removed. The patterned first nitride layers 22 protect surfaces of the patterned substrate 21 from damage during the etch-back process of the second nitride layer 25.

Figure 3D:
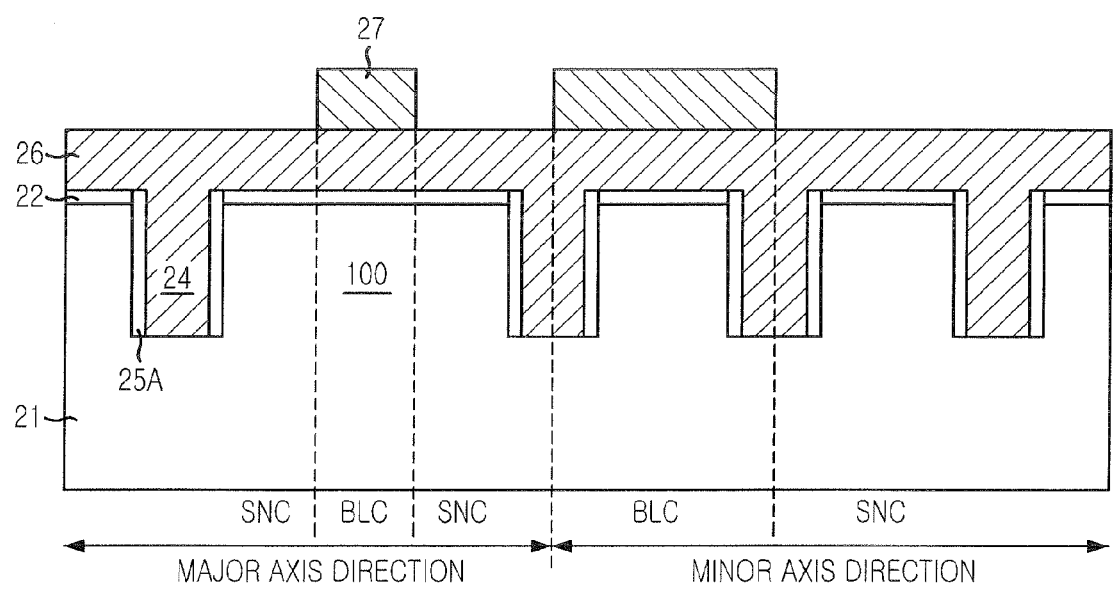
Figure 3E:
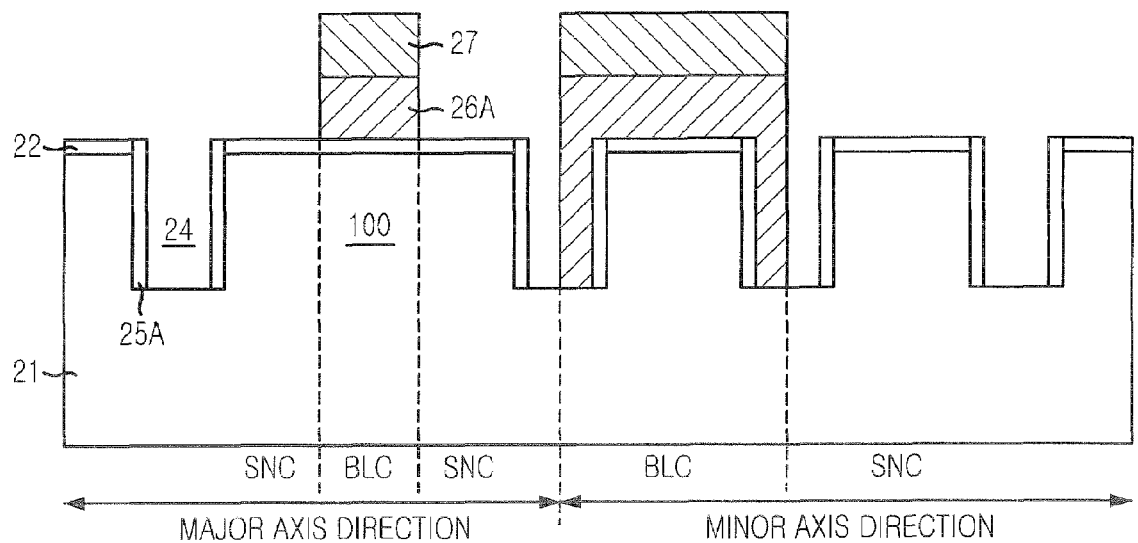

Referring to FIG. 3D, a sacrificial layer 26 is formed over the resulting substrate structure until the first trenches 24 are filled. The sacrificial layer 26 is formed to reduce collapse of the active regions 100 during a subsequent isotropic etching process for forming second trenches. The sacrificial layer 26 includes an oxide-based layer. A photoresist layer is formed over the sacrificial layer 26, and photo-exposure and developing processes are performed to pattern the photoresist layer to form a second mask 27. The second mask 27 is formed in lines that cover the BLC regions and exposes the SNC regions. Referring to FIG. 3E, the sacrificial layer 26 is etched using the second mask 27 as an etch mask to form a patterned sacrificial layer 26A.

Figure 3F:
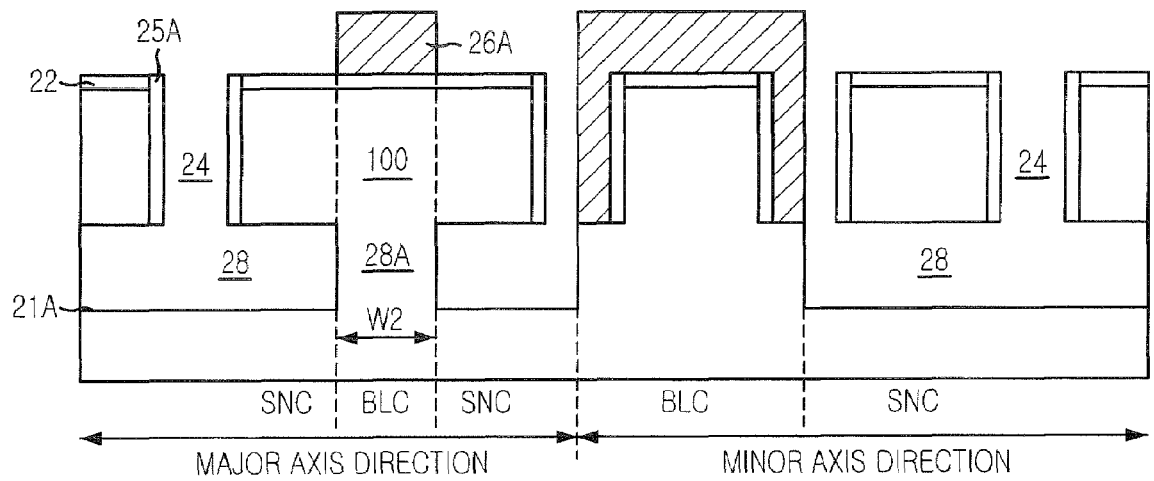

Referring to FIG. 3F, the aforementioned isotropic etching process is performed onto the exposed portions of the patterned substrate 21 to form second trenches 28 and a substrate pattern 21A. The isotropic etching process is performed after the second mask 27 is stripped. The isotropic etching process includes performing a blanket etch-back process. The isotropic etching process uses the same apparatus used to etch the patterned substrate. The bias power of the apparatus is turned of during the isotropic etch step.

The second trenches 28 are formed to extend horizontally below the active regions 100. Since the isotropic etching process is performed while the patterned sacrificial layer 26A remains in the BLC region, the horizontal extension of the second trenches 28 is prevented from entering the BLC region. That is, the horizontal extension occurs in all directions in the SNC regions, but does not occur in the BLC region due to the patterned sacrificial layer 26A. Consequently, a pillar 28A having a width 'W2' is formed. The patterned sacrificial layer 26A functions as an etch barrier and a protection layer when the patterned substrate 21 is isotropically etched.

In the typical method, the isotropic etching process is performed in both of the BLC and SNC regions, resulting in a smaller pillar (refer to 'W1' shown in FIG. 1A). The horizontal extension is prevented from entering the BLC region to obtain a larger area (refer to 'W2' shown in FIG. 3F). Thus, the active regions 100 are less likely to collapse.

Figure 4:
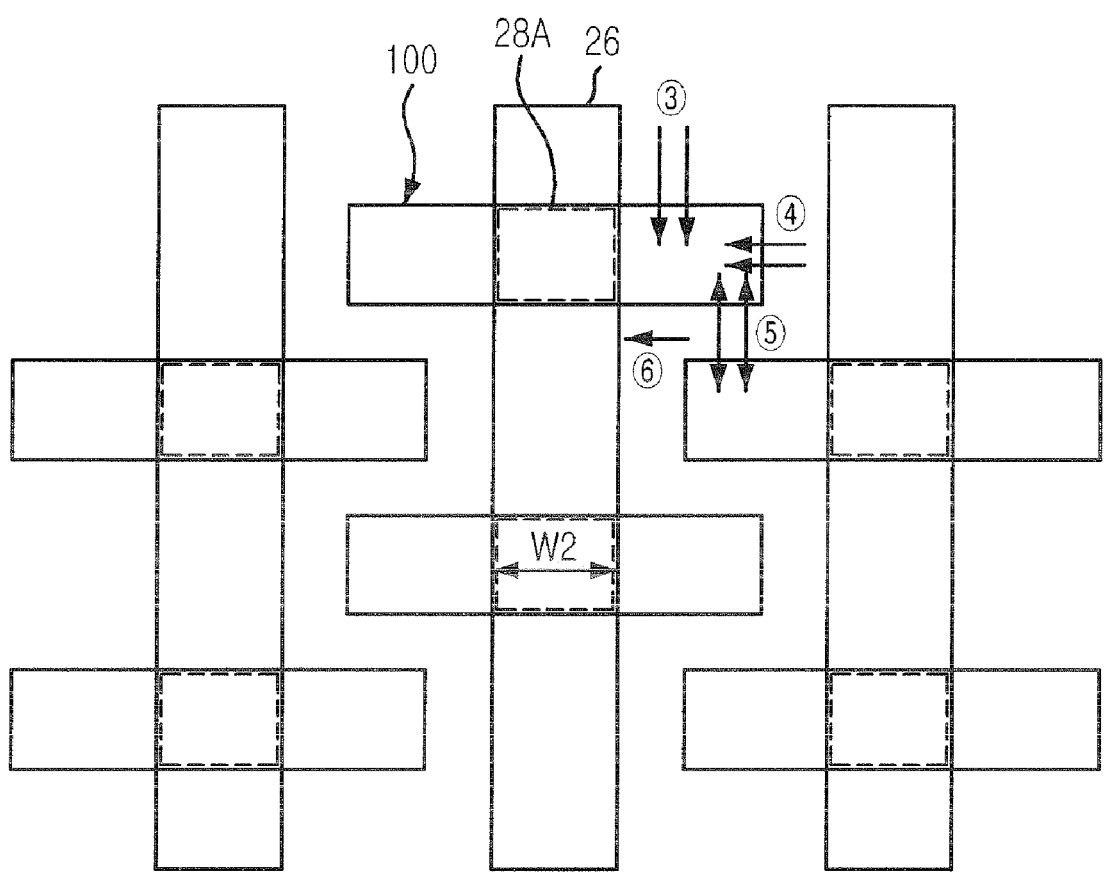
FIG. 4 illustrates a top view of a semiconductor device after second trenches are formed consistent with an embodiment of this invention.

FIG. 4 illustrates a top view of a semiconductor device after second trenches are formed according to an embodiment of this invention. Active regions 100 are less likely to collapse because pillars 28A formed below the active regions 100 have an area as large as the width 'W2' of the patterned sacrificial layers 26A. Even if all of the active regions in SNC regions are etched away (refer to reference numerals ③, ④, and ⑤), sufficiently large areas of the active regions 100 remain because the horizontal extension is prevented from entering the BLC regions (refer to reference numeral ⑥). Although not illustrated, the LSOI process is completed by forming an isolation structure filled in the first and second trenches.

According to one embodiment, using the LSOI process allows the reduction of leakage current by lengthening the current channel between cells without deeply etching the isolation regions. Furthermore, collapse of the active regions can be reduced by securing a sufficiently large area in the BLC region while etching the second trenches for the LSOI process. The present application contains subject matter related to the Korean patent application No. KR 2006-0038701, filed in the Korean Patent Office on Apr. 28, 2006, the entire contents of which being incorporated herein by reference.

While the present invention has been described with respect to specific embodiments, it will be apparent to those skilled in the art that changes and modifications may be made without departing from the spirit and scope of the invention as defined in the following claims.

What is claimed is:

1. A method for fabricating a semiconductor device, the method comprising:

forming a first trench by etching a substrate already provided with a storage node contact (SNC) region and a bit line contact (BLC) region;

forming a protection layer on sidewalls of the first trench;

forming a sacrificial layer over the substrate and filling the first trench;

etching the sacrificial layer to have a portion of the sacrificial layer remain in the first trench in the BLC region of the substrate;

forming a second trench extending horizontally by etching the substrate underneath the first trench; and filling the first and second trenches to form an isolation structure.

2. The method of claim 1, wherein etching the sacrificial layer comprises:

forming a photoresist pattern covering the BLC region and opening the SNC region over the sacrificial layer; and etching the sacrificial layer using the photoresist pattern.

3. The method of claim 2, wherein forming the photoresist pattern comprises forming the photoresist pattern in a line type covering the BLC region and extending to the first trenches adjacent to the BLC region.

4. The method of claim 1, wherein forming the second trench comprises using the same etching apparatus used in etching the sacrificial layer without applying a bias power.

5. The method of claim 1, wherein the sacrificial layer includes an oxide-based layer.

6. The method of claim 1, further comprising, prior to forming the first trench, forming a first nitride layer over the substrate.

7. The method of claim 6, wherein forming the protection layer comprises:

forming a second nitride layer over the first trench and the first nitride layer; and performing an etch-back process on the second nitride layer.

8. The method of claim 1, wherein etching the substrate underneath the first trench comprises performing an isotropic etching process, the isotropic etching process including a blanket etch-back process.

9. A method for fabricating a semiconductor device, the method comprising:

etching a substrate to form a first trench, the first trench extending in a first direction;

forming first and second protection layers on first and second sidewalls of the first trench;

forming a dielectric layer over the substrate to fill the first trench, the dielectric layer including a first portion provided on the first protection layer and a second portion provided on the second protection layer;

etching the dielectric layer to expose a portion of the substrate provided on a lower side of the first trench, the first portion of the dielectric layer remaining on the first protection layer;

etching the substrate to form a second trench extending in a second direction below the first trench; and filling the first and second trenches to form an isolation structure.

10. The method of claim 9, wherein the second portion of the dielectric layer is removed exposing the second protection layer.

11. The method of claim 9, wherein etching the substrate to form the second trench is performed via the exposed portion of the substrate.

12. The method of claim 9, wherein the dielectric layer includes an oxide-based material.

13. The method of claim 9, further comprising, prior to forming the first trench, forming a nitride-based layer over the substrate.

14. The method of claim 9, wherein the first and the second protection layers include a nitride-based material.

15. The method of claim 11, wherein the etching the substrate comprises performing an isotropic etching process, the isotropic etching process including a blanket etch-back process.

* * * * *